(12) United States Patent
Utsumi et al.

(10) Patent No.: US 10,112,376 B2
(45) Date of Patent: Oct. 30, 2018

(54) DEVICE MANUFACTURED BY ROOM-TEMPERATURE BONDING, DEVICE MANUFACTURING METHOD, AND ROOM-TEMPERATURE BONDING APPARATUS

(71) Applicants: MITSUBISHI HEAVY INDUSTRIES MACHINE TOOL CO., LTD., Ritto-shi (JP); NATIONAL INSTITUTE OF ADVANCED INDUSTRIAL SCIENCE AND TECHNOLOGY, Tokyo (JP)

(72) Inventors: Jun Utsumi, Yokohama (JP); Takayuki Goto, Yokohama (JP); Kensuke Ide, Ritto (JP); Masahiro Funayama, Yokohama (JP); Hideki Takagi, Tsukuba (JP)

(73) Assignees: MITSUBISHI HEAVY INDUSTRIES MACHINE TOOL, CO., LTD., Shiga (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 16 days.

(21) Appl. No.: 15/149,891

(22) Filed: May 9, 2016

(65) Prior Publication Data

US 2016/0250838 A1 Sep. 1, 2016

Related U.S. Application Data

(62) Division of application No. 12/302,873, filed as application No. PCT/JP2007/060993 on May 30, 2007, now abandoned.

(30) Foreign Application Priority Data

May 30, 2006 (JP) .................................. 2006-149896

(51) Int. Cl.
*B23K 20/00* (2006.01)
*B32B 38/00* (2006.01)
(Continued)

(52) U.S. Cl.
CPC .......... *B32B 38/0008* (2013.01); *B23K 20/02* (2013.01); *B23K 20/22* (2013.01);
(Continued)

(58) Field of Classification Search
CPC . B32B 38/0008; B32B 37/14; B32B 2457/00; C23C 14/58; C23C 14/14;
(Continued)

(56) References Cited

U.S. PATENT DOCUMENTS 4,011,982 A 3/1977 Marancik
4,245,768 A 1/1981 Sater
(Continued)

FOREIGN PATENT DOCUMENTS

EP 0 808 915 A2 11/1997
JM 8-318378 A 12/1996
(Continued)

OTHER PUBLICATIONS

Machine translation of JP-2004-337927A (no date available).*
(Continued)

*Primary Examiner* — Kiley S Stoner
(74) *Attorney, Agent, or Firm* — Birch, Stewart, Kolasch & Birch, LLP

(57) ABSTRACT

An inter-substrate material layer is formed between a first substrate and a second substrate to generate a bonding strength. A plurality of metal elements are present in the inter-substrate material layer. An interface element existence ratio of the plurality of metal elements is 0.07 or above. A device can be obtained in which substrates difficult to bond
(Continued)

(for example, SiO$_2$ substrates) are bonded at room-temperature to have practical bonding strength.

13 Claims, 5 Drawing Sheets

(51) Int. Cl.
    *B23K 20/02*      (2006.01)
    *B23K 20/22*      (2006.01)
    *B81C 3/00*      (2006.01)
    *B32B 37/14*      (2006.01)
    *C23C 14/14*      (2006.01)
    *C23C 14/34*      (2006.01)
    *C23C 14/58*      (2006.01)

(52) U.S. Cl.
    CPC .............. *B32B 37/14* (2013.01); *B81C 3/001* (2013.01); *C23C 14/14* (2013.01); *C23C 14/3414* (2013.01); *C23C 14/58* (2013.01); *B32B 2457/00* (2013.01); *B81C 2203/032* (2013.01); *Y10T 428/31678* (2015.04)

(58) Field of Classification Search
    CPC ................ C23C 14/3414; B81C 3/001; B81C 2203/032; B23K 20/22; B23K 20/02; B23K 20/00–20/26; Y10T 428/31678
    USPC ............ 228/121–124.7, 235.1–235.3, 234.1, 228/115–117, 3.1
    See application file for complete search history.

(56) References Cited

U.S. PATENT DOCUMENTS

| | | | |
|---|---|---|---|
| 4,309,267 A | 1/1982 | Boyd et al. | |
| 4,349,954 A | 9/1982 | Banks | |
| 4,452,389 A | 6/1984 | Amin | |
| 4,673,475 A * | 6/1987 | Windischmann | C03C 17/22 204/192.11 |
| 4,731,540 A * | 3/1988 | Schmidt | H01J 37/026 204/192.1 |
| 5,083,104 A | 1/1992 | Bassino | |
| 5,089,104 A * | 2/1992 | Kanda | C23C 14/548 204/192.11 |
| 5,148,958 A * | 9/1992 | Eskandari | B23K 20/24 228/116 |
| 5,234,149 A * | 8/1993 | Katz | G01R 1/04 228/123.1 |
| 5,279,724 A * | 1/1994 | Rauch | H01J 37/3408 204/192.12 |
| 5,279,866 A * | 1/1994 | Bourget | C23C 16/511 204/192.1 |
| 5,322,606 A * | 6/1994 | Eskandari | B23K 26/0608 204/298.11 |
| 5,466,355 A | 11/1995 | Ohhashi et al. | |
| 5,543,019 A | 8/1996 | Lee et al. | |
| 5,549,237 A * | 8/1996 | Oeftering | C04B 37/006 118/50 |
| 5,741,404 A | 4/1998 | Cathey | |
| 6,224,718 B1 | 5/2001 | Meyer | |
| 6,335,534 B1 * | 1/2002 | Suguro | H01J 37/3171 250/423 R |
| 6,390,354 B1 * | 5/2002 | Makino | B23K 35/001 228/120 |
| 6,402,900 B1 | 6/2002 | Baldwin et al. | |
| 6,759,143 B2 * | 7/2004 | Oda | C23C 14/3407 204/298.13 |
| 6,783,637 B2 * | 8/2004 | Slaughter | C23C 14/3407 204/192.11 |
| 7,591,293 B2 * | 9/2009 | Suga | H01L 24/81 156/351 |
| 2001/0004047 A1 * | 6/2001 | Kahn | C23C 14/46 204/192.11 |
| 2001/0008714 A1 * | 7/2001 | Sueoka | G11B 5/64 428/847 |
| 2001/0045352 A1 * | 11/2001 | Robinson | C23C 14/46 204/192.11 |
| 2001/0046203 A1 * | 11/2001 | Nishida | B29D 17/005 369/280 |
| 2001/0046597 A1 * | 11/2001 | Weihs | B23K 1/0006 428/336 |
| 2003/0164289 A1 * | 9/2003 | Weihs | B23K 1/0006 204/192.12 |
| 2003/0164394 A1 * | 9/2003 | Suga | B23K 1/20 228/1.1 |
| 2003/0164396 A1 * | 9/2003 | Suga | B23K 1/206 228/219 |
| 2003/0168145 A1 * | 9/2003 | Suga | H01L 21/67092 156/60 |
| 2004/0056070 A1 * | 3/2004 | Ivanov | B21K 25/00 228/174 |
| 2004/0084299 A1 * | 5/2004 | Slaughter | C23C 14/3407 204/192.11 |
| 2004/0157407 A1 * | 8/2004 | Tong | B23K 20/02 438/455 |
| 2004/0169020 A1 * | 9/2004 | Yamauchi | H01L 21/4864 219/121.46 |
| 2004/0180217 A1 * | 9/2004 | Inoue | C23C 14/086 428/432 |
| 2004/0226162 A1 | 11/2004 | Miura | |
| 2005/0040210 A1 * | 2/2005 | Sandin | B23K 35/3033 228/121 |
| 2005/0103444 A1 * | 5/2005 | Brcka | H01J 37/321 156/345.48 |
| 2005/0229737 A1 | 10/2005 | Tsuno et al. | |
| 2005/0241669 A1 * | 11/2005 | Wodecki | B08B 7/0035 134/1.1 |
| 2006/0115672 A1 * | 6/2006 | De Gryse | B23K 20/04 428/689 |
| 2006/0193089 A1 * | 8/2006 | Li | B82Y 10/00 360/324.11 |
| 2006/0249372 A1 * | 11/2006 | Xiang | B01J 19/0046 204/192.11 |
| 2007/0235500 A1 * | 10/2007 | Suh | B23K 1/0006 228/101 |
| 2008/0061114 A1 * | 3/2008 | Taliashvili | B23K 20/02 228/115 |
| 2008/0171215 A1 * | 7/2008 | Kumar | B22F 3/1017 428/546 |
| 2008/0210555 A1 * | 9/2008 | Yang | B22F 3/105 204/298.13 |
| 2008/0245843 A1 * | 10/2008 | Suga | B23K 20/023 228/3.1 |
| 2008/0248320 A1 * | 10/2008 | Grohmann | A61L 27/30 428/457 |
| 2008/0314735 A1 * | 12/2008 | Weihs | C23C 14/3407 204/192.1 |
| 2009/0173626 A1 * | 7/2009 | Duckham | B23K 1/0006 204/298.13 |
| 2009/0186195 A1 * | 7/2009 | Spraker | B23K 1/0006 428/172 |
| 2010/0044415 A1 * | 2/2010 | Ivanov | B23K 20/122 228/112.1 |
| 2010/0092786 A1 * | 4/2010 | Utsumi | B23K 20/02 428/433 |
| 2013/0248738 A1 * | 9/2013 | Suuronen | H01J 37/3171 250/492.21 |
| 2016/0024645 A1 * | 1/2016 | Hunt | C23C 14/46 204/298.03 |
| 2016/0111249 A1 * | 4/2016 | Hunt | G01N 1/44 204/298.03 |
| 2017/0330738 A1 * | 11/2017 | Druz | H01J 37/36 |

FOREIGN PATENT DOCUMENTS

| | | |
|---|---|---|
| JP | 61-67581 | 4/1986 |
| JP | 62-22712 B2 | 5/1987 |
| JP | 62-282788 A | 12/1987 |
| JP | 63-101085 A | 5/1988 |

(56) References Cited

FOREIGN PATENT DOCUMENTS

| | | | |
|---|---|---|---|
| JP | 01073075 A * | 3/1989 | |
| JP | 3-81077 A | 4/1991 | |
| JP | 05274635 A * | 10/1993 | |
| JP | 6-99317 A | 4/1994 | |
| JP | 8-118043 A | 5/1996 | |
| JP | 9-10963 A | 1/1997 | |
| JP | 2791429 B2 | 6/1998 | |
| JP | 2002-64042 A | 2/2002 | |
| JP | 2003-318219 A | 11/2003 | |
| JP | 2004-54170 | 2/2004 | |
| JP | 2004-343359 | 12/2004 | |
| JP | 2005-288673 A | 10/2005 | |
| WO | WO 2004/091838 A2 | 10/2004 | |
| WO | WO 2005/097396 A1 | 10/2005 | |

OTHER PUBLICATIONS

"Stainless Steel", Physical Wikipedia, pp. 1-8 (2006).
Extended European Search Report of Application No. 07744406.5 dated Feb. 3, 2017.
Takagi Hideaki "Hyomen Kasseikaho Ni Yoru Shirikon' U EHA No Joonsetsugo (Room Temperatue Bonding of Silicon Wafers by Surface Activation Method)", Doctoral Dissertation, pp. 37-40 (1999).
Weast et al. "Physical Constants of Inorganic Compounds", Handbook of Chemistry and Physics. Ready Reference Book of Chemical and Physical Data, B67-B146 (1988).
EP Decision to Garnt a Patent dated Oct. 30, 2014 from related Application No. 10172323.7.
Office Action dated May 8, 2012 from related U.S. Appl. No. 12/438,346.
U.S. Office Action issued for U.S. Appl. No. 12/438,346 dated May 5, 2011.
U.S. Final Office Action of U.S. Appl. No. 13/102,778 dated Feb. 27, 2012.
U.S. Non-Final Office Action in U.S. Appl. No. 12/438,346, dated Aug. 26, 2011.
U.S. Non-Final Office Action of U.S. Appl. No. 13/102,778 dated Aug. 26, 2011.
U.S. Notice of Allowance from related U.S. Appl. No. 12/438,346 dated Aug. 7, 2013.
U.S. Notice of Allowance from related U.S. Appl. No. 13/102,778 dated Aug. 12, 2013.
European Communication Pursuant to Article 94(3) EPC dated Feb. 9, 2018 for corresponding European Application No. 07744406.5.
Wu et al., "Slow positron beam study of corrosion-related defects in pure iron," Applied Surface Science, vol. 252, No. 9, 2006 (Published online Sep. 28, 2005), pp. 3274-3277.

\* cited by examiner

DEVICE MANUFACTURED BY ROOM-TEMPERATURE BONDING, DEVICE MANUFACTURING METHOD, AND ROOM-TEMPERATURE BONDING APPARATUS

This application is a Divisional of copending application Ser. No. 12/302,873, filed on Mar. 23, 2009, which was filed as PCT International Application No. PCT/JP2007/060993 on May 30, 2007, which claims the benefit under 35 U.S.C. § 119(a) to Patent Application No. 2006-149896, filed in Japan on May 30, 2006, all of which are hereby expressly incorporated by reference into the present application.

TECHNICAL FIELD

The present invention relates to room-temperature bonding, and in particular, relates to a device manufactured by room-temperature bonding, a manufacturing method of the device, and a room-temperature bonding apparatus therefor.

BACKGROUND ART

A MEMS (Micro Electro-Mechanical Systems) device is known, in which minute electrical parts and mechanical parts are integrated. The MEMS devices are exemplified by a micromachine, a pressure sensor, and a micro motor. A wafer-level semiconductor device manufacturing process is generally employed for manufacturing of the MEMS device. A plurality of devices are formed and sealed on a semiconductor wafer at one time, and the wafer is then divided into individual devices through dicing. In a wafer-level packaging step in this manufacturing process, a sealing wafer is located on and bonded to a device wafer to seal and manufacture the devices.

In recent years, a manufacturing method is proposed which uses a direct bonding method for bonding substrates. In the direct bonding method, which does not use adhesive material and solder, another material layer is not present at a bonding interface. For this reason, there is an advantage that high bonding strength and good interface properties can be obtained. As an example of a conventional direct bonding method for the manufacturing of the MEMS device, anodic bonding and diffusion bonding are exemplified. Additionally, a bonding method in which a hydroxyl group is provided to a flattened and cleaned surface to obtain strong bonding through hydrogen bonding and heat treatment, is also proposed in recent years.

With the direct bonding method, however, heat treatment involved in a bonding process or a process after the bonding process causes a problem in the manufacturing of the MEMS device. Many MEMS devices are formed by bonding substrates which are determined based on usage situation and manufacturing requirement. For this reason, there is a case that thermal strain is caused at a bonding interface due to heat treatment and that reliability and durability of the device are lost, when coefficients of thermal expansion of substrates are different. Reduction in temperature of the bonding process is a great technical theme in the manufacturing of the MEMS device. Another theme on the manufacturing is that a tact time at the time of manufacturing cannot be reduced since a time is taken for heating and cooling.

From the above views, realization of a room-temperature bonding process is desired which does not involve a heating step in the bonding process. In this case, in the room-temperature bonding process, especially, in which the bonding is performed by use of dangling bonds on bonding surfaces without providing an active group on the surfaces, bonding performance is greatly affected based on material properties of the substrates. An oxide material frequently used as an electronic device material, especially an $SiO_2$ material (synthetic quartz, glass and so forth), is known as a material difficult in bonding in the room-temperature bonding process.

Although the room-temperature bonding process was conventionally known as one of metal bonding processes, an application field of the room-temperature bonding process has been gradually developed to bonding of semiconductor materials and oxide materials in recent years. In case of the oxide material such as $Al_2O_3$, it is known that a certain degree of bonding strength can be obtained through surface activation and pressure welding, as disclosed in a report by Takagi et al. (NEDO Preliminary Drafts of Research Promotion Project Accomplishment Debrief Session for the 15th year of the Heisei era, pp. 220-225 (2003)). However, in most oxide materials, practical bonding strength has not been obtained. For this reason, methods have been proposed which use surface treatment such as provision of an active group to bonding surfaces and heat treatment.

Japanese Patent Application Publication (JP-P2004-054170A) discloses a bonding method for laser optical crystals. Only ion beam etching is performed to a bonding surface without using an interface bonding layer of adhesive material, and then the laser optical crystals are bonded. This method has been developed as the bonding method for laser optical crystals, especially for $YVO_4$ crystals. This method can be applied to some of oxide materials but cannot be applied to $SiO_2$ material, as mentioned above. In addition, heat treatment after the bonding process causes a problem in terms of the application to the MEMS device manufacturing process.

Japanese Patent Application Publication (JP-P2005-104810A) discloses a method of bonding a functional ceramic polycrystalline body and a single crystalline semiconductor material such as Si at room temperature. In this method, a metal thin film having reaction activity is formed of the semiconductor material on the surface of the ceramic polycrystalline body and the bonding is achieved through a reaction product layer generated through reaction between the metal thin film and the semiconductor material. This is an effective method for bonding of a ceramic substrate with great surface roughness. Since this method presupposes reactivity between a bonding target substrate and a metal layer, target materials is restricted, and in some cases, heating treatment is required at the time of bonding.

On the other hand, a report by Takagi (Report by Mechanical Engineering laboratory, Number 189 (2000)) pointed out a possibility of room-temperature bonding for a bonding difficult material such as $SiO_2$, in which bonding strength cannot be obtained only by surface activation and pressure welding, by forming a metal film on the bonding surface. Specific methods for this have been proposed so far.

Japanese Patent Application Publication (JP-P2004-337927A) discloses formation of a metal thin film on a bonding surface as a conventional method of bonding ionic crystal substrates which are hard to be bonded by the room-temperature bonding method. An inert gas ion beam or an inert gas neutral atomic beam, and a metal ion beam or a metal neutral atom beam are radiated to the bonding surface in a vacuum, to form a metal thin film with a film thickness of 1 nm to 100 nm on a bonding surface of each substrate.

Japanese Patent Application Publication (JP-P2004-343359A) discloses a manufacturing method of a surface acoustic wave device using a room-temperature bonding method. In the method, the bonding is carried out through interface bonding layers. A piezoelectric single crystalline substrate such as LiTaO$_2$ and an Al$_2$O$_2$ substrate or a crystalline substrate such as or Si are bonded by a surface activation process and a pressure welding process without heat treatment at a high temperature. As one example in this method, the bonding is carried out by forming the interface bonding layers of Si, insulating material and metal.

As mentioned above, it is difficult to bond SiO$_2$ material substrates with a practical bonding strength by only a surface activation process and a pressure welding process, and it is effective to interpose a film of bonding functional material such as metal at the bonding interface in order to achieve practical bonding strength. However, sufficient consideration has not been performed to proper conditions of a composition of an interface bonding metal layer and concentrations of elements of the layer. In particular, quantitative estimation has not been enough about proper amounts of metal atoms for achieving the practical bonding strength. The formation of the interface bonding metal layer of an excessive thickness causes a disadvantage of an increase in time required for a process of forming the interface bonding layer, so that a process cost increases and production efficiency drops due to an increase in a tact time. Also, the formation of the interface bonding metal layer affects a physical property of a device bonding interface to possibly lose performance of a device. For example, when the interface bonding metal layer is formed by using a physical sputtering method such as an ion beam method, sputtering of the bonding surface advances simultaneously with the formation of the interface bonding metal layer as a radiation time becomes longer. As a result, surface roughness of the bonding surface increases so that the bonding strength drops.

DISCLOSURE OF INVENTION

An object of the present invention is to provide a device and a manufacturing method of the device, in which substrates are bonded more strongly.

Another object of the present invention is to provide a device manufacturing method, in which a bonding condition of substrates of bonding difficult materials is optimized.

Still another object of the present invention is to provide a device and a manufacturing method of the device, in which substrates of bonding difficult materials (e.g. SiO$_2$ material substrates) are bonded at room-temperature to have a practical bonding strength.

Yet still another object of the present invention is to provide a room-temperature bonding apparatus, in which a proper bonding condition of substrates of bonding difficult materials is optimized.

A device according to the present invention has a first substrate and a second substrate. At this time, at least one metal element is present in a bonding interface between the first substrate and the second substrate. The first substrate and the second substrate are bonded by use of the metal element by a room-temperature bonding method.

It is preferable that an interface element existence ratio of one or more metal elements should be 0.07 or above. The interface element existence ratio is more preferably 0.1 or above, and still more preferably 0.2 or above. Here, the interface element existence ratio means a ratio of the number of atoms of one or more metal elements, to the entire number of atoms present in the bonding interface. More specifically, the interface element existence ratio is defined as a ratio of the number of atoms of one or more metal elements for the bonding, to a total of the number of atoms of component elements of the bonded substrates and the number of atoms of one or more metal elements in the bonding interface. A part of the bonding interface on the side of each of the substrates is a range from a bonding plane to the depth of 5 nm in the substrate. This value is quantitatively given by a composition analyzer used in general, such as X-ray photoelectron spectroscopy (XPS) and energy dispersive fluorescent X-ray analysis (EDX analysis) using a transmission electron microscope.

When a plurality of metal elements exist in the bonding interface, the plurality of metal elements are exemplified by a set of metal elements selected from the group consisting of: a set of iron and chromium, a set of iron and aluminum, a set of iron, chromium, and aluminum, a set of iron, chromium, and nickel, and a set of iron, chromium, nickel, and aluminum. The metal atoms are distributed continuously or discontinuously in the bonding interface between the first substrate and the second substrate, in the form of layers, in the form of islands or in the form of layers intermittently. A metal element other than the above set of metal elements may be present in the bonding interface. For example, any of tungsten W, gold Au, silver Ag, copper Cu, tantalum Ta, and zinc Zn may be contained.

In the device of the present invention, the main component of the first substrate may be oxide, e.g. silicon dioxide. Also, the first substrate in the device of the present invention may be selected from the group of consisting of: a single crystalline material substrate, a polycrystalline material substrate, a glass substrate, a ceramics substrate, or a combination thereof. Alternatively, the main component of the first substrate in the device of the present invention may be fluoride, carbide, or nitride. Additionally, the main component of the first substrate may be the same as that of the second substrate.

The device manufacturing method according to the present invention includes sputtering the surface of a first substrate, attaching at least one metal to the surface of the first substrate, and bonding the second substrate to the surface of the first substrate at room temperature. It is preferable that an interface element existence ratio of one or more metal elements should be 0.07 or above. In the device manufacturing method of the present invention, the surface of the second substrate is sputtered simultaneously with the sputtering of the surface of the first substrate. Additionally, the device manufacturing method of the present invention includes attaching at least one metal to the surface of the substrate simultaneously with the sputtering of the surface of the substrate.

When a plurality of metal elements are contained in the bonding interface, the plurality of metal elements are exemplified by a set of metal elements selected from the group consisting of: a set of iron and chromium, a set of iron and aluminum, a set of iron, chromium, and aluminum, a set of iron, chromium, and nickel, and a set of iron, chromium, nickel, and aluminum. In the bonding interface, a metal element other than the above set of metal elements may be present. For example, any of tungsten W, gold Au, silver Ag, copper Cu, tantalum Ta, and zinc Zn may be contained.

The surfaces of the first substrate and the second substrate are sputtered with accelerated particles being radiated. On the other hand, at least one metal is emitted from a metal emitter, to which the accelerated particles are radiated, and is attached onto the surfaces of the substrates. The metal emitter is exemplified by structural members or component parts of internal units of the bonding apparatus, or a substrate holding mechanism, a stage moving mechanism, and a substrate pressure welding mechanism. In the device manufacturing method of the present invention, an amount of atoms of each of metal elements emitted toward the surface of the substrate is properly adjusted to form an interface bonding metal layer having practical bonding strength, by controlling parameters concerning the particles which are accelerated and radiated toward the metal emitter. More in detail, it is preferable that the velocity of particles accelerated and radiated should be set such that the interface element existence ratio of one or more metal elements is 0.07 or above. For example, when an ion beam is used for sputtering, the velocity of radiated particles can be controlled based on an acceleration voltage applied to an ion beam source. Additionally, it is preferable that a radiation time during which the particles are radiated should be set such that the interface element existence ratio of one or more metal elements is 0.07 or above. In addition, it is preferable that a radiation amount of particles radiated per unit time should be set such that the interface element existence ratio of the plurality of metal elements is 0.07 or above.

It is preferable that the bonding apparatus includes a vacuum chamber which produces vacuum atmosphere therein, a holding mechanism which holds substrates under the vacuum atmosphere, a positioning mechanism which transfers the substrates to given positions, a physical sputtering mechanism which activates bonding surfaces of the substrates, and a pressure welding mechanism which performs pressure welding by pressing the activated bonding surfaces to each other. In addition, it is preferable that any of an internal wall and structural members of the vacuum chamber, and structural members and component parts of the holding mechanism, the positioning mechanism, and the pressure welding mechanism should be formed of material which emits metal particles of a plurality of metal elements in the composition when being sputtered by the physical sputtering mechanism, and the metal particles attach to the surfaces of the substrates such that an interface element existence ratio of the plurality of metal elements is 0.07 or above.

The metal elements are exemplified by a set of metal elements selected from the group consisting of: a set of iron and chromium, a set of iron and aluminum, a set of iron, chromium, and aluminum, a set of iron, chromium, and nickel, and a set of iron, chromium, nickel, and aluminum. At the interface, a metal element other than the above set of metal elements may be present. For example, any of tungsten W, gold Au, silver Ag, copper Cu, tantalum Ta, and zinc Zn may be contained.

BEST MODE FOR CARRYING OUT THE INVENTION

Figure 1:
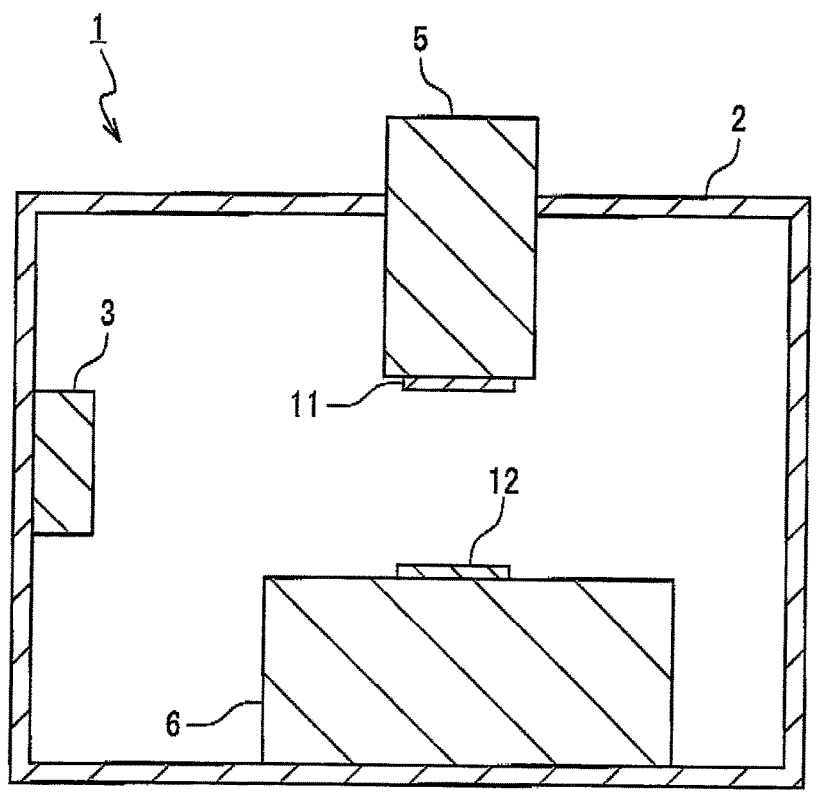
FIG. 1 is a sectional view showing a room-temperature bonding apparatus according to an embodiment of the present invention.

Hereinafter, a room-temperature bonding apparatus according to the present invention will be described in detail with reference to the attached drawings. FIG. 1 shows a room-temperature bonding apparatus 1 according to an embodiment of the present invention. As shown in FIG. 1, the room-temperature bonding apparatus 1 has a vacuum chamber 2, an ion gun 3, an upper stage 5, and a lower stage 6.

The vacuum chamber 2 is a chamber which secures an internal space and isolates the internal space from the surroundings. A part or the whole of the vacuum chamber 2 is formed of material which emits iron Fe, aluminum Al, and chromium Cr in a composition during sputtering. The material is exemplified by stainless steel which contains iron Fe and chromium Cr in the composition. The vacuum chamber 2 has a lid (not shown) and is connected to a vacuum pump (not shown). The vacuum pump discharges gas from the vacuum chamber 2. The vacuum pump is exemplified by a turbo-molecular pump which performs discharge as a result of flicking gas molecules by a plurality of internal metal blades. The lid is used to close and open a gate connected to the vacuum chamber 2.

An upper stage 5 is formed in the shape of cylindrical column and is supported to be movable in parallel in a vertical direction. The upper stage 5 is formed of material which emits iron Fe, aluminum Al, and chromium Cr in a composition during the sputtering, and for example, is formed of stainless steel containing iron Fe and chromium Cr in the composition, and aluminum Al. The upper stage 5 has a dielectric layer on the lower end of the column, and when a voltage is applied between the dielectric layer and a substrate 11, and absorbs and supports the substrate 11 toward the dielectric layer with electrostatic force. The upper stage 5 is connected with a pressure welding mechanism, which is not shown. The pressure welding mechanism moves the upper stage 5 in a vertical direction in the vacuum chamber 2 in accordance with a user operation.

A lower stage 6 is formed of material which emits iron Fe, aluminum Al, and chromium Cr in the composition during the sputtering, and is formed, for example, of stainless steel containing iron Fe and chromium Cr in the composition, and aluminum Al. The lower stage 6 is connected with a stage moving mechanism, which is not shown. The stage moving mechanism moves the lower stage 6 in a horizontal direction and rotationally moves the lower stage 6 around a rotation axis which is parallel to the vertical axis, in accordance with a user operation. The lower stage 6 includes a substrate holder as a substrate holding mechanism formed of aluminum, for example. Additionally, the substrate holding mechanism may be provided with a dielectric layer on the upper end of the lower stage 6, and absorb and hold the substrate 12 toward the dielectric layer with electrostatic force which is generated by applying a voltage between the dielectric layer and the substrate 12.

The ion gun 3 is directed to the substrate 11 supported by the upper stage 5 and the substrate 12 supported by the lower stage 6. The ion gun 3 accelerates and emits charged particles. The charged particles are exemplified by argon ions. The vacuum chamber 2 may further have an electron gun, which is not shown. The electron gun is positioned toward a target, to which the charged particles are emitted from the ion gun 3, and emits electrons toward the target. Such electrons are used to electrically neutralize the target which is positively charged by the charged particles emitted by the ion gun 3.

A plurality of metal atoms are emitted from a metal emitter by receiving the radiation of the charged particles. The metal emitter is provided in the vacuum chamber 2, and may be structural members of the vacuum chamber, or surface members of the substrate holding mechanism including the upper and lower stages, the substrate moving mechanism, and the pressure welding mechanism.

FIGS. 2 to 5 show the states of the substrate 11 and the substrate 12 when performing a room-temperature bonding process by the room-temperature bonding apparatus 1. An operator firstly opens the lid of the vacuum chamber 2, to make the upper stage 5 hold the substrate 11 and make the lower stage 6 hold the substrate 12. The operator closes the lid of the vacuum chamber 2 and vacuums inside of the vacuum chamber 2 to a vacuum atmosphere. Then, the operator operates the stage moving mechanism of the lower stage 6 and moves the lower stage 6 in the horizontal direction such that the substrate 11 faces the substrate 12.

Figure 2:
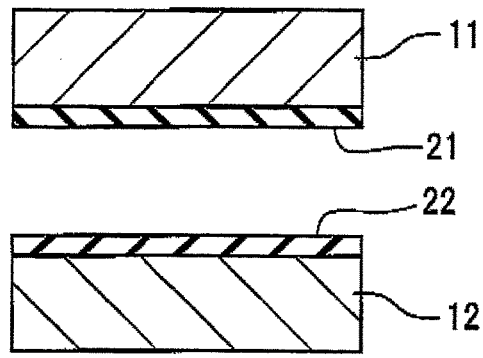
FIG. 2 is a sectional view showing an initial state of substrates.

At this time, an inactive surface layer 21 has been formed on the surface of the substrate 11 as shown in FIG. 2. The inactive surface layer 21 is composed of impurity which is attached on the substrate surface, products metamorphosed from the substrate, or a material top surface layer in which bonds are terminated with oxygen and the like to set the surface to a poor reaction activity state. The inactive surface layer 22 is formed on the surface of the substrate 12 similarly in case of the substrate 11. The inactive surface layer 22 is formed from impurity attached to the surface, products metamorphosed from the substrate material, or a material top surface layer in which bonds are terminated with oxygen to set the surface to a poor reaction activity state.

Figure 3:
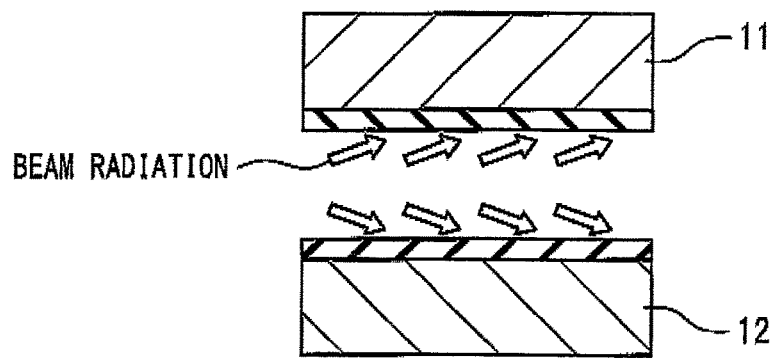
FIG. 3 is a sectional view showing a state of substrates when surfaces of the substrates are cleaned.

The operator operates the ion gun 3 to emit the charged particles toward the substrates 11 and 12 which are separated enough, as shown in FIG. 3. At this time, the substrates 11 and 12 are sputtered with the charged particles so that the inactive surface layers 21 and 22 are removed. The charged particles are also radiated to the metal emitter in the chamber (e.g. the vacuum chamber 2, the upper stage 5, and the lower stage 6). The metal emitter is sputtered through radiation of the charged particles, and emits a plurality of component metal atoms, e.g. iron Fe, aluminum Al, and chromium Cr, into the vacuum atmosphere. At this time, the operator adjusts radiation conditions of the charged particles through change of the setting of operation parameters of the ion gun 3. Thus, emitted metal atoms form an intermediate material layer on the surface of each substrate such that the interface element existence ratio takes a proper value in a range.

Figure 4:
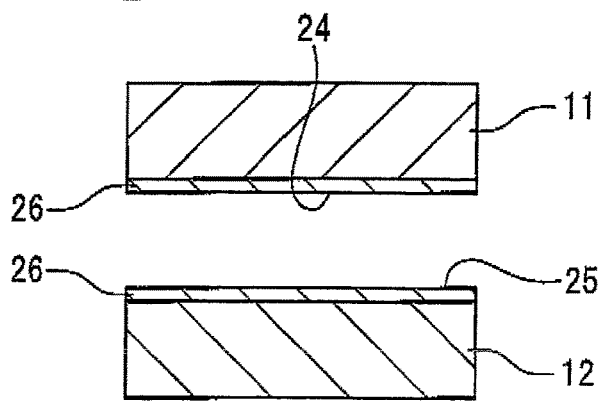
FIG. 4 is a sectional view showing a state of the substrates when interface bonding layers are formed.

As shown in FIG. 4, when the radiation of the charged particles ends, an active surface 24 of the substrate 11 is exposed and an active surface 25 of the substrate 12 is exposed. The intermediate material layers 26 are formed in the active surfaces 24 and 25. The intermediate material layers 26 are formed of elements emitted from the vacuum chamber 2, the upper stage 5, and the lower stage 6, e.g. iron Fe, aluminum Al, and chromium Cr.

Figure 5:
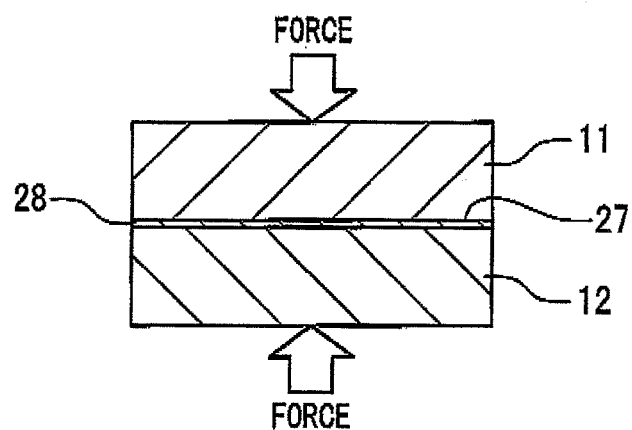
FIG. 5 is a sectional view showing of the substrates when the substrates are bonded.

As shown in FIG. 5, the operator operates the pressure welding mechanism such that the upper stage 5 lowers in the vertical direction and the substrate 11 and the substrate 12 come into contact with each other. The substrate 11 and the substrate 12 are bonded at room temperature through the contact, and are strongly bonded into a unitary body. At this time, an inter-substrate material layer 28 is formed from the intermediate material layers 26 between the substrate 11 and the substrate 12. The inter-substrate material layer 28 serves to increase bonding strength of the substrate 11 and the substrate 12.

It should be noted that in the above-mentioned example, the vacuum chamber 2 is formed of stainless steel, the upper stage 5 and the lower stage 6 are formed of stainless steel and aluminum, and the substrate holding mechanism is formed of aluminum. However, a part of these mechanisms may be formed of other materials. For example, the vacuum chamber 2 may be formed of aluminum. Also, the upper stage 5 and the lower stage 6 may be formed of aluminum alloy, for example. In addition, the substrate holding mechanism may be formed of stainless steel.

In a room-temperature bonding method according to the embodiment of the present invention, the device is produced by using the room-temperature bonding apparatus 1. In the room-temperature bonding method according to the present invention, the operation parameters of the physical sputtering mechanism are determined, such that concentrations of elements the inter-mediate material layer formed in the bonding interface as a bonding functional material layer are within a proper range to attain practical bonding strength.

The operation parameters are exemplified by a voltage with which the ion gun 3 accelerates the charged particles, a time during which the ion gun 3 radiates the charged particles, and an amount of charged particles which the ion gun 3 emits (beam intensity, amount of current). The operator determines the operation parameters based on a relation of the operation parameters and a measured value of the interface element existence ratio of a plurality of metal atoms present in the bonding interface, such that the interface element existence ratio of the metal elements falls within a proper range. The proper range is exemplified by 0.07 or above. Then, the substrates 11 and 12 are bonded after the inactive surface layers are removed by sputtering.

The interface element existence ratio of the plurality of metal elements is defined as a ratio of the number of atoms of one or more metal elements involved in the bonding interface, to a total of the number of atoms of component elements of the substrates and the number of atoms of the one or more metal elements in the bonding interface. That is to say, the ratio of the numbers of atoms of one or more metal elements in the bonding interface (e.g. iron Fe, chromium Cr, and aluminum Al), to the total of the number of atoms of component elements of the substrates in the bonding interface (e.g. silicon Si and oxygen O in case of a quartz glass substrate) and the number of atoms of the one or more metal elements involved in the bonding interface (e.g. iron Fe, chromium Cr, and aluminum Al) is defined as the interface element existence ratio of one or more metal elements involved in the bonding interface. A bonding interface portion on side of each substrate is a range from a bonding plane to the depth of 5 nm.

The interface element existence ratio can be calculated based on element concentrations in the bonding interface measured by a general analysis method. The measuring method of the element concentration is exemplified by X-ray photoelectron spectroscopy (XPS). In case of the XPS, signal intensity in proportion to the number of existing atoms is measured and a composition of component elements of the substrate and metal elements is calculated from the signal intensities. Based on this analysis result, the interface element existence ratio of the metal elements can be calculated. The operator determines the operation parameters such that the interface element existence ratio of one or more metal elements is 0.07 or above. Additionally, it is preferable that the operator should determine the operation parameters such that the interface element existence ratio is 0.1 or above. It is more preferable that the operator should determine the operation parameters such that the interface element existence ratio is 0.2 or above. In addition, the metal atoms may also be iron and chromium. The metal atoms may further be iron and aluminum. The metal atoms may further be iron, chromium, and nickel. The metal atoms may further be iron, chromium, nickel, and aluminum.

According to the room-temperature bonding method, a plurality of metal elements are appropriately present in the bonding interface of the device product, and the bonding interface has strong and practical bonding strength. For this reason, the room-temperature bonding method of the present invention makes it possible to perform the room-temperature bonding process of substrates formed of materials which are hard to be bonded at room temperature so as to have stronger and practical bonding strength without causing deterioration in device performance and any drop in productivity due to excessive formation of the intermediate material layer and redundancy of a process time. The substrate material is exemplified by oxide, nitride, carbide, fluoride, and metal. The oxide substrate is exemplified by an $SiO_2$ substrate and an $Al_2O_3$ substrate. The $SiO_2$ substrate is exemplified by substrates of quartz, synthetic quartz, Pyrex (registered trademark), glass, and quartz glass. The $Al_2O_3$ substrate is exemplified by substrates of sapphire and alumina. The nitride substrate is exemplified by a silicon nitride SiN substrate and a titanium nitride TiN substrate. The carbide substrate is exemplified by a silicon carbide SiC substrate and a titanium carbide TiC substrate. The fluoride substrate is exemplified by a calcium fluoride $CaF_2$ substrate and a magnesium fluoride $MgF_2$ substrate. The metal substrate is exemplified by a substrate of simple metal and alloy. The substrate is further exemplified by substrates of an optical crystal, piezoelectric material and magneto-strictive material. The optical crystal substrate is exemplified by substrates of $CaCO_3$, $YVO_4$, and YAG. The piezoelectric material and magneto-strictive material are exemplified by PZT. The room-temperature bonding method of the present invention is applicable even when two substrates to be bonded at room temperature are formed of different materials among the above-mentioned materials, and makes it possible to bond the two substrates at room temperature more strongly without causing deterioration in device performance and a drop in productivity due to excessive formation of the intermediate material layer and redundancy of process time.

In case of the device products manufactured by the room-temperature bonding method, an interface element existence ratio of one or more metal elements present in the bonding interface can be measured. The measuring method is exemplified by EDX analysis by using a transmission electron microscope. The X-ray photoelectron spectroscopy (XPS) mentioned above and the EDX analysis by using the transmission electron microscope can quantitatively analyze element concentrations though the approaches are different, and there is a correlation between the results of concentration analysis derived from the respective analysis methods. Based on this correlation, it is possible to analyze and estimate an interface element existence ratio of one or more metal elements present in the bonding interface and confirm that the interface element existence ratio is within a proper range as bonding conditions.

Figure 6:
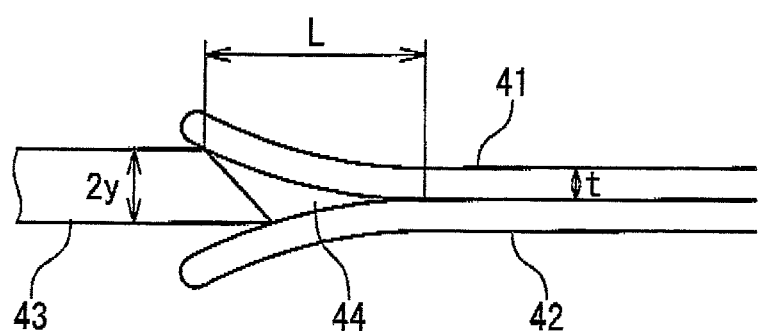
FIG. 6 is a sectional view showing the state of the substrates when estimating bonding strength.

Bonding strength of the substrates bonded at room temperature can be estimated by using biding energy of a bonding section. The coupling energy can be estimated with a well-known blade insertion method. The blade insertion method is disclosed by Maszara et al. (J. Appl. Phys. 64 (10) pp. 4943-4950 (1988)), for example. FIG. 6 shows the state of substrates when coupling energy is to be measured by the blade insertion method. That is, the operator inserts a razor blade 43 in the bonding interface between a substrate 41 and a substrate 42 bonded at room temperature. At this time, the substrate 41 and the substrate 42 are separated from each other to generate a crack 44. The operator measures an extension length of the crack 44. Coupling energy • per unit area of one surface in the bonding interface is expressed by the following equation by using the extension length L of the crack 44, a half value y of the thickness of the razor blade 43, and a thickness t of each of the substrates 41 and 42, and a Young's modulus E of the substrates 41 and 42:

$$\gamma = \frac{3Et^3y^2}{8L^4}$$

The coupling energy • shows that bonding strength is greater and the substrates are more difficult to be separated, as the value is larger.

As a reference of practical bonding strength, the value of the coupling energy • is 0.1 $J/m^2$ or above, for example. Also, the coupling energy • being 0.1 $J/m^2$ or above shows that the substrate 41 and the substrate 42 are bonded not to be separated when dicing of the substrate 41 and the substrate 42 is gently performed, though the bonding strength is weak. The coupling energy • being 0.5 $J/m^2$ or above shows that the substrate 41 and the substrate 42 are bonded with practical bonding strength not to be separated when dicing of the substrate 41 and the substrate 42 is performed at high speed.

Figure 7:
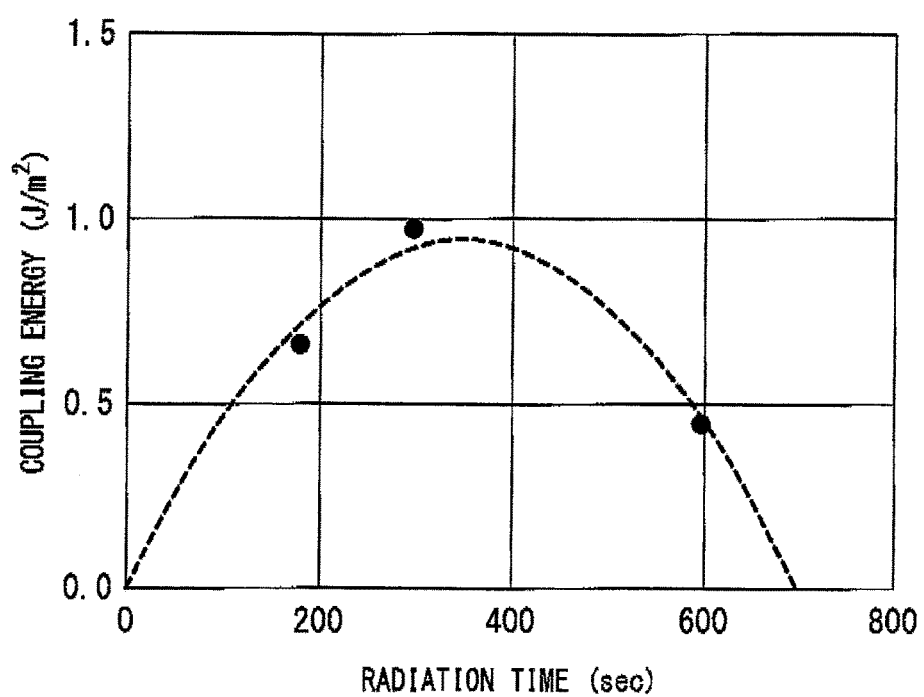
FIG. 7 is a graph showing change in coupling energy with respect to radiation time.

While the coupling energy increases with increase in metal elements which generate a bonding function, excessive process causes decrease in the coupling energy. A substrate is known to increase surface roughness of a surface as being sputtered. Furthermore, a substrate is known to decrease bonding strength as surface roughness of a surface to be bonded at room temperature increases. FIG. 7 shows a relation of coupling energy and radiation time (time for sputtering) during which the charged particles are radiated to the substrate, in bonding of substrates by the room-temperature bonding apparatus. The graph shown in FIG. 7 shows that metal elements involved in the bonding interface as bonding functional material increases with radiation time so that the coupling energy increases when radiation time is shorter than a certain value, and that the effect of increase in surface roughness due to the extension of radiation time becomes greater so that the coupling energy decreases, when the radiation time is longer than that value. That is to say, radiation time has a proper range (an upper limit and a lower limit).

Figure 8:
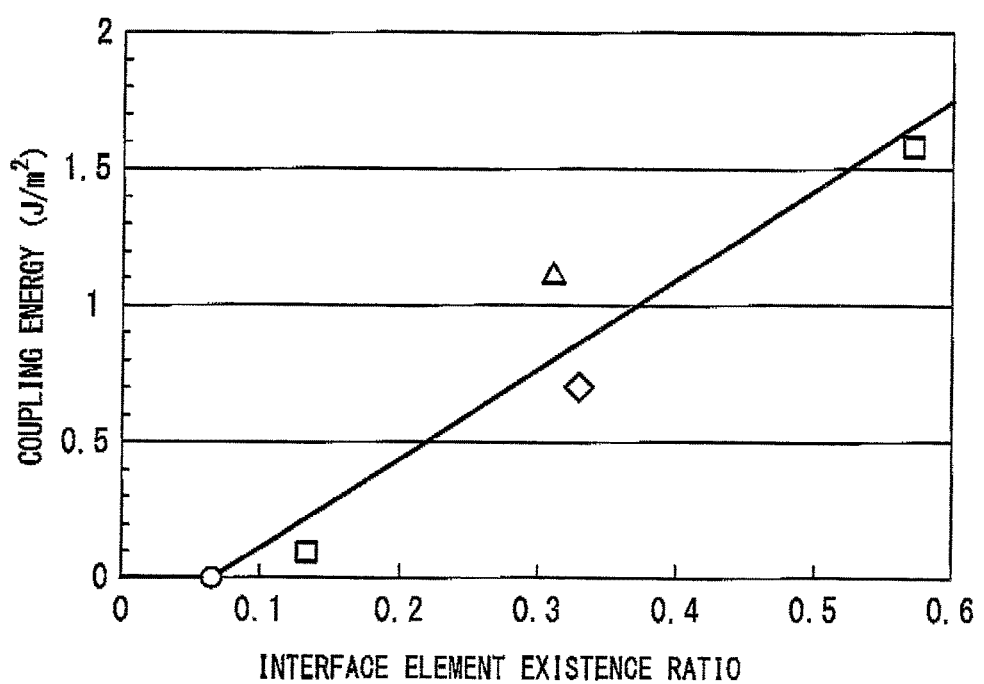
FIG. 8 is a graph showing change in coupling energy with respect to an interface element existence ratio in a bonding interface.

FIG. 8 shows a relation of bonding strength and an interface element existence ratio in a bonding interface. The interface element existence ratio x is calculated based on a result of measurement of element concentrations in the bonding interface measured from a surface of the substrate before being bonded by using the XPS. The coupling energy y is generally expressed by the following equation by using the interface element existence ratio x:

$$y=3.336x-0.242$$

That is to say, the graph shown in FIG. 8 shows a correlation between the interface element existence ratio x and the coupling energy y. The graph of FIG. 8 also shows that the coupling energy becomes 0.0 J/m² or above so that substrates can be bonded at room temperature, when the interface element existence ratio is 0.07 or above. The graph of FIG. 8 further shows that the coupling energy reaches 0.1 J/m² or above, and the substrates are bonded not to be separated if dicing is gentle, when the interface element existence ratio is 0.1 or above. The graph of FIG. 8 further shows that the coupling energy becomes 0.5 J/m² or above and the substrates are bonded not to be separated even if dicing is performed at high speed, when the interface element existence ratio is 0.2 or above. That is to say, it is possible to manufacture a device having practical bonding strength of 0.5 J/m² or above without causing performance degradation, by performing sputtering and bonding under operation conditions which do not excessively exceed the operation parameters that the interface element existence ratio of 0.2 or above can be achieved. In addition, a correlation is calculated without depending on a specific measuring method of measuring element concentrations in the bonding interface. An interface element existence ratio calculated by other measuring methods also shows a correlation with the coupling energy y. Additionally, the interface element existence ratio can be calculated based on a result of measurement of element concentrations in the bonding interface of the substrates. The measuring method is exemplified by the EDX analysis using a transmission electron microscope. The interface element existence ratio calculated for the bonded substrates also shows a correlation with the coupling energy y in the same way.

A device manufactured according to the embodiment of the present invention is manufactured by the room-temperature bonding apparatus 1. The device is exemplified by a micro-machine, a pressure sensor, and a micro motor. The device has two substrates to be bonded at room temperature. The substrates are formed of materials which are hard to be bonded at room temperature. The material is exemplified by oxide, nitride, carbide, fluoride, and metal. The oxide is exemplified by $SiO_2$ and $Al_2O_3$. The $SiO_2$ is exemplified by quartz, synthetic quartz, Pyrex (registered trademark), glass, and quartz glass. The $Al_2O_3$ is exemplified by sapphire and alumina. The nitride is exemplified by silicon nitride SiN and titanium nitride TiN. The carbide is exemplified by silicon carbide SiC and titanium carbide TiC. The fluoride is exemplified by calcium fluoride $CaF_2$ and magnesium fluoride $MgF_2$. The metal is exemplified by simple metal and alloy. The material is further exemplified by an optical crystal, and piezoelectric material and magneto-strictive material. The optical crystal is exemplified by $CaCO_3$, $YVO_4$, and YAG. The piezoelectric material and magneto-strictive material are exemplified by PZT. The two substrates are formed of the same material or formed of different materials.

An inter-substrate material layer is formed in the bonding interface between the two substrates. The inter-substrate material layer may be placed in a part of the bonding interface or placed in the entire part of the bonding interface. The inter-substrate material layer may be formed of a plurality of metal elements. The metal elements are exemplified by iron, aluminum, and chromium. The inter-substrate material layer is formed such that the metal elements in the bonding interface have the interface element existence ratio of 0.07 or above. It can be measured by using an energy dispersive X-ray fluorescence analyzer (EDX) that the device has the inter-substrate material layer. The device according to the present invention has stronger bonding strength in the interface bonded at room temperature with an inter-substrate material layer. Additionally, it is more preferable that the inter-substrate material layer should be formed such that the metal atoms in the bonding interface have the interface element existence ratio of 0.1 or above, and it is still more preferable that the inter-substrate material layer should be formed such that the interface element existence ratio is 0.2 or above.

The invention claimed is:

1. A method of manufacturing a device, comprising:
performing sputtering on a surface of a first substrate, such that sputtering ions directly emit to the first substrate and a second substrate;
attaching one or more metal elements onto the surface of said first substrate; and
bonding the second substrate to the surface of said first substrate at room temperature,
wherein the performing sputtering comprises sputtering ions missing the first substrate and the second substrate to emit to a metal emitter to sputter the metal emitter, and
wherein an interface element existence ratio of said one or more metal elements is 0.07 or above and 0.6 or below,
wherein the performing sputtering comprises sputtering ions to a substrate holding mechanism that supports the first and second substrates in a chamber, the substrate holding mechanism being made of metal, and wherein the substrate holding mechanism includes an upper stage that holds the first substrate and a lower stage that holds the second substrate.

2. The method according to claim 1, wherein the interface element existence ratio of said one or more metal elements is 0.1 or above.

3. The method according to claim 2, wherein the interface element existence ratio of said one or more metal elements is 0.2 or above.

4. The method according to claim 1, further comprising:
performing the sputtering on a surface of said second substrate at the same time that the surface of said first substrate is sputtered.

5. The method according to claim 1, wherein said performing is performed as the same time as said attaching.

6. The method according to claim 1, wherein said performing comprises:
radiating accelerated particles to sputter the surface of said first substrate, and
said attaching comprises:
attaching said one or more metal elements on the surface of said first substrate, wherein said one or more metal elements are emitted from a metal emitter to which the accelerated particles are radiated.

7. The method according to claim 6, wherein said metal emitter is at least one of a bonding apparatus, structural members and parts of a substrate holding mechanism a stage moving mechanism, and a substrate pressure welding mechanism disposed in said bonding apparatus.

8. The method according to claim 6, wherein a parameter of the radiation of the particles is a velocity of the particles.

9. The method according to claim 6, wherein a parameter of the radiation of the particles is a radiation time during which the particles are radiated.

10. The method according to claim 6, wherein a parameter of the radiation of the particles is an amount of the particles radiated onto the surface of said first substrate per a unit time.

11. The method according to any of claim 1, wherein a plurality of said metal elements are attached, and
said plurality of metal elements are a set of metal elements selected the group consisting of:
a set of iron and chromium,
a set of iron and aluminum,
a set of iron, chromium, and aluminum,
a set of iron, chromium, and nickel, and
a set of iron, chromium, nickel, and aluminum.

12. The method according to claim 9, wherein the radiation time during which the particles are radiated is longer than 100 seconds and shorter than 600 seconds.

13. The method according to claim 12, wherein a coupling energy is 0.5 J/m$^2$ or above.

* * * * *